United States Patent
Holt et al.

(10) Patent No.: US 11,127,843 B2
(45) Date of Patent: Sep. 21, 2021

(54) ASYMMETRICAL LATERAL HETEROJUNCTION BIPOLAR TRANSISTORS

(71) Applicant: GLOBALFOUNDRIES U.S. Inc., Santa Clara, CA (US)

(72) Inventors: Judson Holt, Ballston Lake, NY (US); Alexander Derrickson, Troy, NY (US); Ryan Sporer, Mechanicville, NY (US); George R. Mulfinger, Gansevoort, NY (US); Alexander Martin, Greenfield Center, NY (US); Jagar Singh, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/733,528

(22) Filed: Jan. 3, 2020

(65) Prior Publication Data
US 2021/0091212 A1 Mar. 25, 2021

Related U.S. Application Data

(60) Provisional application No. 62/904,279, filed on Sep. 23, 2019.

(51) Int. Cl.
*H01L 29/737* (2006.01)
*H01L 29/06* (2006.01)
*H01L 29/66* (2006.01)
*H01L 21/3065* (2006.01)
*H01L 29/10* (2006.01)

(52) U.S. Cl.
CPC ........ *H01L 29/737* (2013.01); *H01L 21/3065* (2013.01); *H01L 29/0649* (2013.01); *H01L 29/1008* (2013.01); *H01L 29/66242* (2013.01)

(58) Field of Classification Search
CPC .............. H01L 29/737; H01L 29/0649; H01L 21/3065; H01L 29/66242; H01L 29/1008
See application file for complete search history.

(56) References Cited

U.S. PATENT DOCUMENTS

| 8,441,084 | B2 | 5/2013 | Cai et al. |
| 9,437,718 | B1 | 9/2016 | Cai et al. |
| 9,525,027 | B2 | 12/2016 | Hashemi et al. |

OTHER PUBLICATIONS

Mitrovic, Review of SiGe HBTs on SOI, 2005, Solid State Electronics, 49, 1556-1567 (Year: 2005).*

* cited by examiner

*Primary Examiner* — Syed I Gheyas
(74) *Attorney, Agent, or Firm* — Thompson Hine LLP; Anthony Canale

(57) ABSTRACT

Structures for a heterojunction bipolar transistor and methods of forming a structure for a heterojunction bipolar transistor. A base layer is positioned in a cavity in a semiconductor layer, a first terminal is coupled to the base layer, and a second terminal is coupled to a portion of the semiconductor layer. The second terminal is laterally spaced from the first terminal, and the portion of the semiconductor layer is laterally positioned between the second terminal and the base layer.

20 Claims, 4 Drawing Sheets

ASYMMETRICAL LATERAL HETEROJUNCTION BIPOLAR TRANSISTORS

CROSS-REFERENCE TO RELATED APPLICATIONS

This application claims the benefit of U.S. Provisional Application No. 62/904,279, filed Sep. 23, 2019, which is hereby incorporated by reference herein in its entirety.

BACKGROUND

The invention relates generally to semiconductor devices and integrated circuit fabrication and, in particular, to structures for a heterojunction bipolar transistor and methods of forming a structure for a heterojunction bipolar transistor.

A bipolar junction transistor is a multi-terminal electronic device that includes an emitter, a collector, and an intrinsic base arranged between the emitter and collector. In an NPN bipolar junction transistor, the emitter and collector are composed of n-type semiconductor material, and the intrinsic base is composed of p-type semiconductor material. In a PNP bipolar junction transistor, the emitter and collector are composed of p-type semiconductor material, and the intrinsic base is composed of n-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be constituted by silicon, and the intrinsic base of a heterojunction bipolar transistor may be constituted by a silicon-germanium alloy, which is characterized by a narrower band gap than silicon.

Although existing structures have proven suitable for their intended purpose, improved structures for a heterojunction bipolar transistor and methods of forming a structure for a heterojunction bipolar transistor are needed.

SUMMARY

In an embodiment of the invention, a structure for a heterojunction bipolar transistor is provided. The structure includes a semiconductor layer having a cavity, a base layer positioned in the cavity, a first terminal coupled to the base layer, and a second terminal coupled to a portion of the semiconductor layer. The second terminal is laterally spaced from the first terminal, and the portion of the semiconductor layer is laterally positioned between the second terminal and the base layer.

In an embodiment of the invention, a method of forming a structure for a heterojunction bipolar transistor is provided. The method includes forming a cavity in a semiconductor layer, forming a base layer in the cavity, forming a first terminal coupled to the base layer, and forming a second terminal coupled to a portion of the semiconductor layer. The second terminal is laterally spaced from the first terminal, and the portion of the semiconductor layer is laterally positioned between the second terminal and the base layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
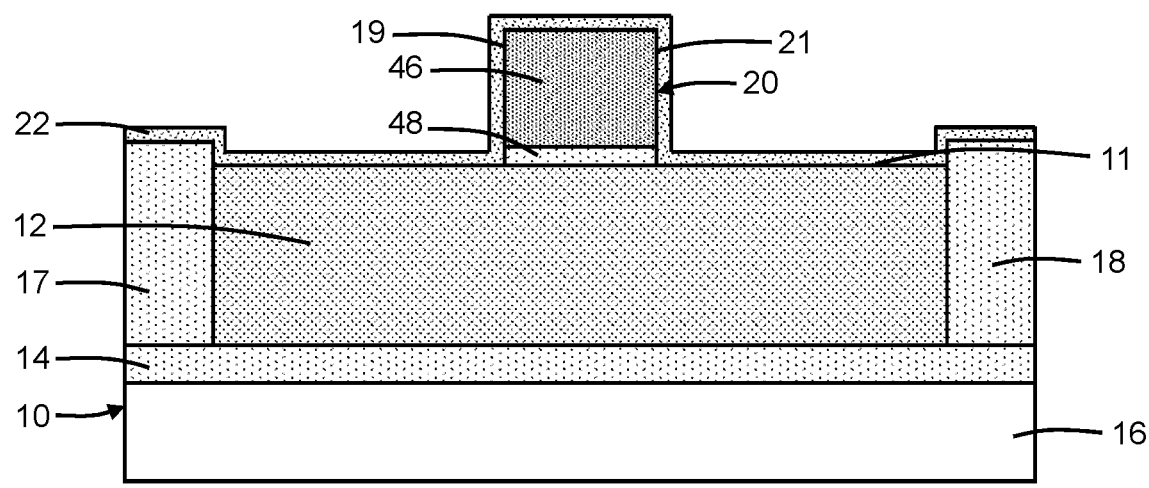
FIGS. 1-6 are cross-sectional views of a structure at successive fabrication stages of a processing method for fabricating a device structure in accordance with embodiments of the invention.

With reference to FIG. 1 and in accordance with embodiments of the invention, a substrate 10 in the representative form of a semiconductor-on-insulator (SOI) substrate includes a device layer 12 defining a semiconductor layer, a buried insulator layer 14, and a handle wafer 16. The device layer 12 is separated from the handle wafer 16 by the intervening buried insulator layer 14 and is considerably thinner than the handle wafer 16. The device layer 12 and the handle wafer 16 may be composed of a single-crystal semiconductor material, such as single-crystal silicon, and may be lightly doped to have, for example, p-type conductivity, and the buried insulator layer 14 may be composed of a dielectric material, such as silicon dioxide. The buried insulator layer 14 has a lower surface in direct contact with the handle wafer 16 along an interface and an upper surface in direct contact with the device layer 12 along another interface, and these surfaces are separated by the thickness of the buried insulator layer 14 and terminate at the rim of the substrate 10. The device layer 12 is electrically isolated from the handle wafer 16 by the buried insulator layer 14. The device layer 12 has a thickness, t1, between the buried insulator layer 14 and its top surface 11. In an embodiment, the thickness of the device layer 12 may range from about 3 nanometers (nm) to about 200 nm. In an alternative embodiment, the substrate 10 may be a bulk semiconductor substrate composed of, for example, single-crystal silicon.

Shallow trench isolation regions 17, 18 may be formed that extend fully through the device layer 12 to the buried insulator layer 14 by etching trenches using a patterned hardmask, depositing a dielectric material, such as silicon dioxide, in the trenches, and planarizing with chemical-mechanical polishing. The shallow trench isolation regions 17, 18 surround an active region of the device layer 12 in which a device structure may be subsequently formed. The active region of the device layer 12 may be lightly-doped to have, for example, p-type electrical conductivity.

A dummy structure 20 may be formed on the top surface 11 of the device layer 12. The dummy structure 20 may be composed of a polysilicon layer 46 and an oxide layer 48 that is positioned between the polysilicon layer 46 and the top surface 11 of the device layer 12. The dummy structure 20 includes a side surface 19 and a side surface 21 opposite to the side surface 19. A conformal layer 22 is formed over the shallow trench isolation regions 17, 18, the dummy structure 20, and the portions of the top surface 11 of the device layer 12 between the shallow trench isolation regions 17, 18 and dummy structure 20. The conformal layer 22 is patterned with lithography and etching processes to open the top surface 11 of the device layer 12 between the side surface 21 of the dummy structure 20 and the shallow trench isolation region 18. The conformal layer 22 is not removed from the top surface 11 of the device layer 12 between the side surface 19 of the dummy structure 20 and the shallow trench isolation region 17.

Figure 2:
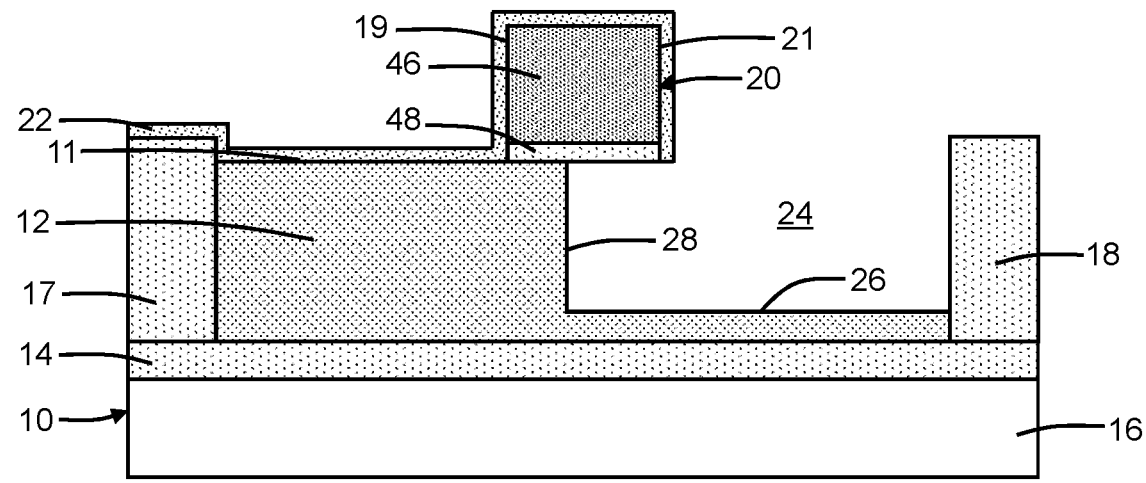

With reference to FIG. 2 in which like reference numerals refer to like features in FIG. 1 and at a subsequent fabrication stage, a cavity 24 is formed as an undercut recess in a portion of the device layer 12 using an etching process, such as a reactive ion etching processes. The depth of the cavity 24 relative to the top surface 11 of the device layer 12 is controlled such that the cavity 24 does not penetrate fully through the device layer 12 to the buried insulator layer 14. As a result, a surface 26 of the device layer 12 is located at the bottom of the cavity 24. The top surface 11 of the device layer 12 adjacent to the side surface 19 of the dummy structure 20 is covered and masked by the conformal layer 22 during the performance of the etching process. The formation of the cavity 24 by the etching process, which removes the semiconductor material of the device layer 12 selective to the materials of the shallow trench isolation region 18 and the conformal layer 22, is self-aligned by the shallow trench isolation region 18 and the conformal layer 22. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process.

The etching process includes a lateral etching component that generates the lateral removal of the semiconductor material of the device layer 12 and that extends the cavity 24 beneath the dummy structure 20 to provide an undercut. The cavity 24 extends in a lateral direction partially across the active device region from the shallow trench isolation region 18 to a surface 28 of the device layer 12. In an embodiment, the cavity 24 may be shaped such that the surface 28 is located beneath the dummy structure 20. The surfaces 26, 28 of the device layer 12 and the shallow trench isolation region 18 provide boundaries for the cavity 24.

Figure 3:
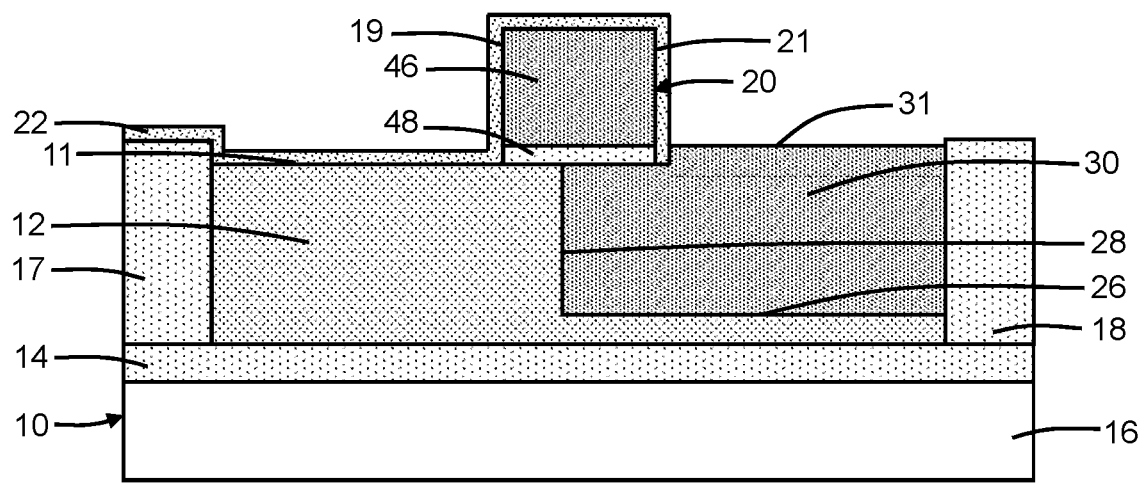

With reference to FIG. 3 in which like reference numerals refer to like features in FIG. 2 and at a subsequent fabrication stage, a base layer 30 is formed in the cavity 24. The base layer 30 is constrained during its formation by the surfaces 26, 28 of the device layer 12 and the shallow trench isolation region 18. A portion of the base layer 30 is in direct contact with the surface 26 of the device layer 12 beneath the dummy structure 20 to define an interface. Another portion of the base layer 30 is in direct contact with the surface 28 of the device layer 12 at the bottom of the cavity 24 to define another interface. Another portion of the base layer 30 is in direct contact with the shallow trench isolation region 18 at the side of the cavity 24. A portion of the device layer 12 is located adjacent to the interface with the base layer 30 at surface 26. Another portion of the device layer 12 is located adjacent to the interface with the base layer 30 at surface 28 and between the base layer 30 and the buried insulator layer 14.

The base layer 30 has a top surface 31. In an embodiment, the top surface 31 of the base layer 30 adjacent to the side surface 21 of the dummy structure 20 projects above the top surface 11 of the device layer 12 adjacent to the side surface 19 of the dummy structure 20 such that the top surfaces 11, 31 on either side of the dummy structure 20 are located at different elevations. Beneath the dummy structure 20, the top surface 11 of the contacted portion of the device layer 12 and top surface 31 of the contacted portion of the base layer 30 may be coplanar or substantially coplanar. In an alternative embodiment, the oxide layer 48 may be removed at least in part by a pre-clean prior to epitaxially growing the base layer 30.

The base layer 30 may be provided by single-crystal semiconductor material that is epitaxially grown inside the cavity 24. In that regard, the base layer 30 may be formed by the epitaxial growth of semiconductor material from the surfaces 26, 28 of the device layer 12. In an embodiment, the semiconductor material of the base layer 30 may be composed at least in part of a silicon-germanium alloy including silicon and germanium combined in an alloy with the silicon content ranging from 95 atomic percent to 50 atomic percent and the germanium content ranging from 5 atomic percent to 50 atomic percent. The germanium content of the base layer 30 may be uniform, or the germanium content of the base layer 30 may have a graded and/or stepped profile across its thickness with portions that lack germanium. The base layer 30 may be in situ doped during epitaxial growth with a concentration of a dopant, such as a p-type dopant (e.g., boron) that provides p-type conductivity. In an embodiment, the base layer 30 may be formed by a selective epitaxial growth process in which the conformal layer 22 prohibits epitaxial growth from either the dummy structure 20 or the portion of the top surface 11 of the device layer 12 between the side surface 19 of the dummy structure 20 and the shallow trench isolation region 17.

In an embodiment, the base layer 30 may include sublayers that provide a graded composition profile. For example, the base layer 30 may include, in order of formation, a sublayer closest to the surfaces 26, 28 having a composition (e.g., silicon with no germanium) similar to the device layer 12, a sublayer composed of silicon-germanium that is doped with a p-type dopant during epitaxial growth, a sublayer composed of silicon-germanium with a higher germanium content than the prior sublayer, a sublayer composed of silicon-germanium with a higher germanium content than the prior sublayers, and finally an uppermost sublayer that lacks germanium (e.g., silicon with no germanium).

In another embodiment, the base layer 30 may be non-selectively deposited polycrystalline silicon (polysilicon) or polycrystalline silicon-germanium followed by planarization to remove the excess overburden material. In alternative embodiments, the base layer 30 may be composed of a different semiconductor material, such as silicon carbide or a III-V semiconductor material like indium phosphide or gallium nitride.

Figure 4:
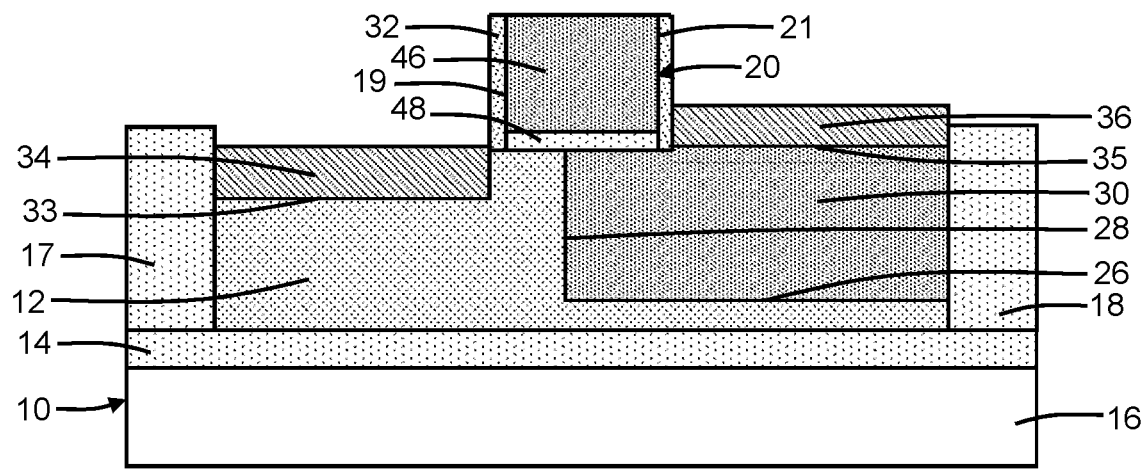

With reference to FIG. 4 in which like reference numerals refer to like features in FIG. 3 and at a subsequent fabrication stage, the conformal layer 22 is removed from the top surface 11 of the device layer 12 with an anisotropic etching process that also forms sidewall spacers 32 on the side surfaces 19, 21 of the dummy structure 20. A terminal 34 is formed on the top surface 11 of the device layer 12 adjacent to the side surface 19 of the dummy structure 20. A terminal 36 is formed on the top surface 31 of the base layer 30 adjacent to the side surface 21 of the dummy structure 20. The terminal 36 may project to a higher elevation than the terminal 34 due to the higher elevation of the top surface 31 of the base layer 30 relative to the top surface 11 of the device layer 12.

The terminals 34, 36 may be formed by epitaxial growth of semiconductor material (e.g., single-crystal silicon) from the top surface 11 of the device layer 12 and the base layer 30. Alternatively, the device layer 12 adjacent to the side surface 19 of the dummy structure 20 and an upper portion of the base layer 30 may be doped by ion implantation to form the terminals 34, 36. Alternatively, both epitaxial growth and ion implantation may be employed to form the terminals 34, 36. In an embodiment, the terminals 34, 36 may be doped during epitaxial growth or by ion implantation to have an opposite conductivity type from the base layer 30. In an embodiment, the semiconductor material of the terminals 34, 36 may contain with a concentration of a dopant, such as an n-type dopant (e.g., phosphorus or arsenic) that provides n-type conductivity. In an embodiment, the terminals 34, 36 may be doped to have the same conductivity type as the active region of the device layer 12. In an embodiment, the terminals 34, 36 may be doped to have an opposite conductivity type from the active region of the device layer 12. In an embodiment, the active region of the device layer 12 may be undoped.

In an embodiment, the terminal 34 may provide a collector of a lateral heterojunction bipolar transistor, and the terminal 36 may provide an emitter of the lateral heterojunction bipolar transistor. In an embodiment, the terminal 34 may provide an emitter of a lateral heterojunction bipolar transistor, and the terminal 36 may provide a collector of the lateral heterojunction bipolar transistor. In either arrangement, the base layer 30 is situated between the terminals 34, 36, a heterojunction 33 is defined at an interface between the device layer 12 and the terminal 34, and another heterojunction 35 is defined at an interface between the base layer 30 and the terminal 36.

The terminal 36, which is located on the base layer 30, is formed after the formation of the base layer 30. In the representative embodiment, the terminal 34 is formed after the formation of the base layer 30 and may be concurrently formed with the terminal 36. In an alternative embodiment, the terminal 34 may be formed before the formation of the base layer 30.

Figure 5:
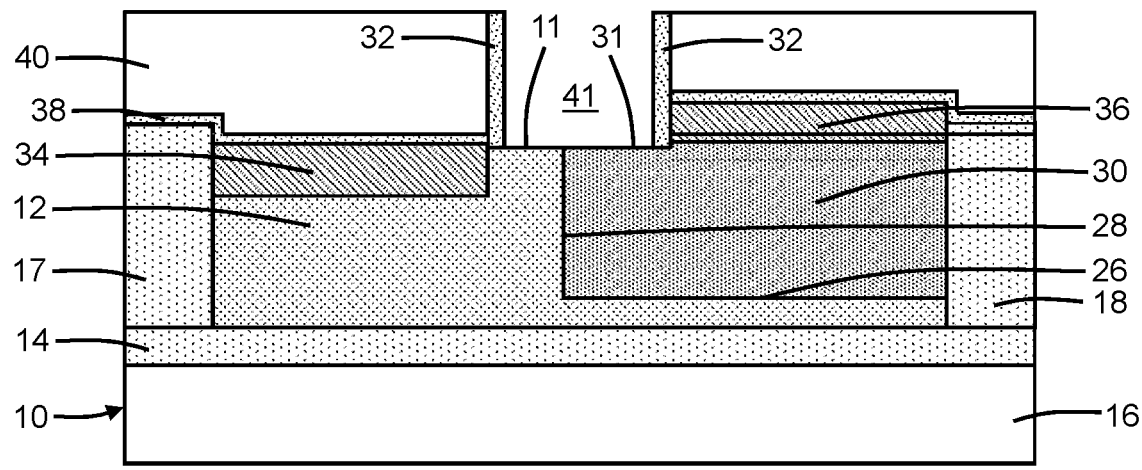

With reference to FIG. 5 in which like reference numerals refer to like features in FIG. 4 and at a subsequent fabrication stage, a liner 38 composed of a dielectric material, such as silicon nitride, may be deposited, and a dielectric layer 40 composed of a dielectric material, such as silicon dioxide, may be deposited and planarized. The dummy structure 20 may then be removed by an etching process, which forms a cavity 41 between the sidewall spacers 32. The cavity 41 is located in part over a portion of the device layer 12 and in part over a portion of the base layer 30.

Figure 6:
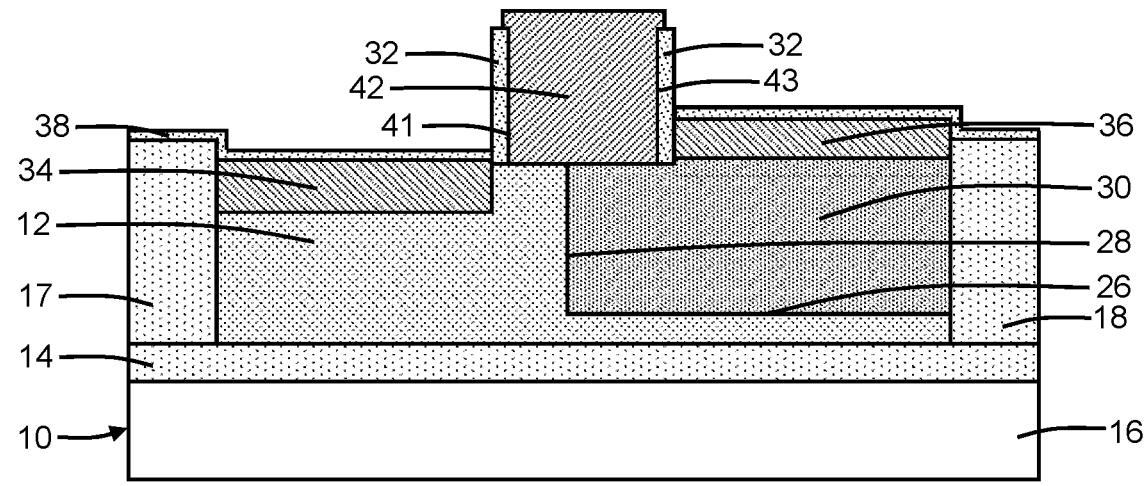

With reference to FIG. 6 in which like reference numerals refer to like features in FIG. 5 and at a subsequent fabrication stage, a contact 42 may be formed in the space opened by the removal of the dummy structure 20. The contact 42 may contain semiconductor material that is doped to have the same conductivity type (e.g., p-type conductivity) as the device layer 12 and the base layer 30. The dielectric layer 40 may be removed by an etching process after forming the contact 42. The contact 42 is in direct contact with the top surface 11 of a portion of the device layer 12 and the top surface 31 of a portion of the base layer 30. The contact 42 includes a side surface 41 adjacent to the terminal 34 and an opposite side surface 43 adjacent to the terminal 36.

The arrangement of the base layer 30, which contains silicon-germanium, is asymmetrical relative to the contact 42. The base layer 30, and the surface 28 defining the interface between the base layer 30 and the device layer 12, are located laterally between the side surfaces 41, 43 of the contact 42. A portion of the device layer 12 is located on one side of the surface 28 and the base layer 30 and its cavity 24 are located on an opposite of the surface 28, which reflects the asymmetrical arrangement.

Figure 7:
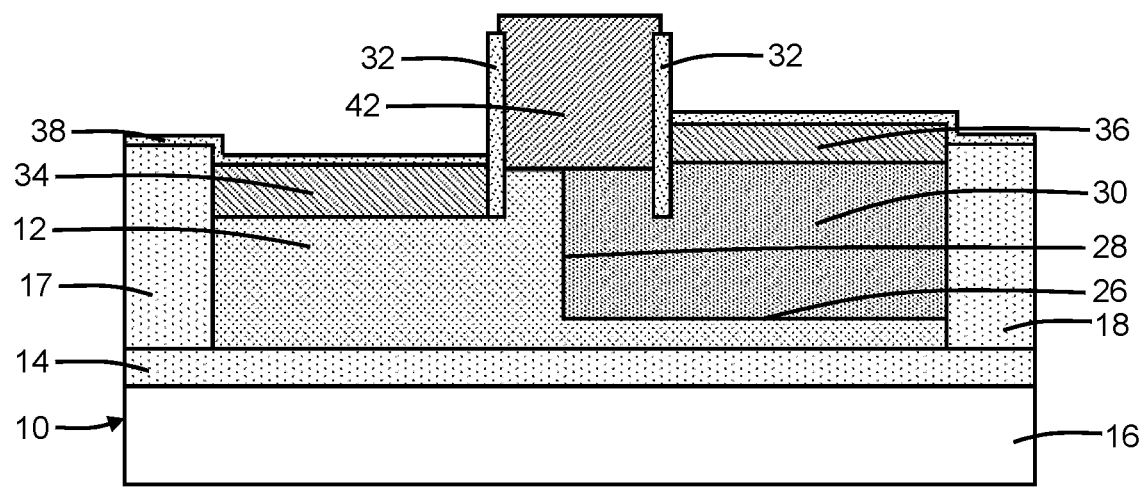
FIG. 7 is a cross-sectional view of a structure in accordance with alternative embodiments of the invention.

With reference to FIG. 7 in which like reference numerals refer to like features in FIG. 6 and in accordance with alternative embodiments, the device layer 12 and the base layer 30 may be recessed relative to the shallow trench isolation regions 17, 18 before forming the conformal layer 22 and, subsequently, the sidewall spacers 32 on the side surfaces 19, 21 of the dummy structure 20 and the terminals 34, 36. The sidewall spacers 32 are lengthened as a result, which may provide further electrical isolation and increase the breakdown voltage. The sidewall spacers 32 extend beyond the top surface 11 of the portion of the device layer 12 and the top surface 31 of the portion of the base layer 30 that are in direct contact with the contact 42.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a heterojunction bipolar transistor, the structure comprising:
a semiconductor layer including a cavity;
a base layer positioned in the cavity;

a first terminal coupled to the base layer;
a second terminal coupled to a portion of the semiconductor layer, the second terminal laterally spaced from the first terminal;
a contact laterally positioned between the first terminal and the second terminal, the contact coupled to a portion of the base layer and to the portion of the semiconductor layer;
a first sidewall spacer laterally positioned between the contact and the first terminal; and
a second sidewall spacer laterally positioned between the contact and the second terminal,
wherein the portion of the semiconductor layer is laterally positioned between the second terminal and the base layer, the portion of the base layer includes a first surface beneath the contact, the portion of the semiconductor layer includes a second surface beneath the contact, the first sidewall spacer extends beyond the first surface, and the second sidewall spacer extends beyond the second surface.

2. The structure of claim 1 wherein the contact directly contacts the portion of the base layer and the portion of the semiconductor layer.

3. The structure of claim 1 wherein the portion of the base layer and the portion of the semiconductor layer intersect at an interface beneath the contact.

4. The structure of claim 1 wherein the first surface is substantially coplanar with the second surface.

5. The structure of claim 1 wherein the semiconductor layer is positioned on a dielectric layer, and further comprising;
a first shallow trench isolation region extending through the semiconductor layer to the dielectric layer and a second shallow trench isolation region extending through the semiconductor layer to the dielectric layer,
wherein the first terminal is laterally positioned between the contact and the first shallow trench isolation region, and the second terminal is laterally positioned between the contact and the second shallow trench isolation region.

6. The structure of claim 5 wherein the semiconductor layer and the base layer are laterally positioned between the first shallow trench isolation region and the second shallow trench isolation region.

7. The structure of claim 1 wherein the first terminal is an emitter of the heterojunction bipolar transistor, and the second terminal is a collector of the heterojunction bipolar transistor.

8. The structure of claim 1 wherein the first terminal is a collector of the heterojunction bipolar transistor, and the second terminal is an emitter of the heterojunction bipolar transistor.

9. The structure of claim 1 wherein the base layer is comprised of a material that forms a heterojunction with the first terminal.

10. The structure of claim 1 further comprising:
a dielectric layer,
wherein the semiconductor layer is positioned on the dielectric layer, and the cavity extends only partially through the semiconductor layer.

11. A structure of for a heterojunction bipolar transistor, the structure comprising:
a semiconductor layer including a cavity;
a base layer positioned in the cavity;
a first terminal coupled to the base layer;
a second terminal coupled to a portion of the semiconductor layer, the second terminal laterally spaced from the first terminal;
a contact laterally positioned between the first terminal and the second terminal, the contact coupled to a portion of the base layer and to the portion of the semiconductor layer;
a first sidewall spacer laterally positioned between the contact and the first terminal; and
a second sidewall spacer laterally positioned between the contact and the second terminal,
wherein the portion of the semiconductor layer is laterally positioned between the second terminal and the base layer, the portion of the base layer includes a first surface beneath the contact, the portion of the semiconductor layer includes a second surface beneath the contact, the first sidewall spacer terminates at the first surface, and the second sidewall spacer terminates at the second surface.

12. The structure of claim 11 wherein the first surface is substantially coplanar with the second surface.

13. The structure of claim 11 wherein the contact directly contacts the portion of the base layer and the portion of the semiconductor layer.

14. The structure of claim 11 wherein the portion of the base layer and the portion of the semiconductor layer intersect at an interface beneath the contact.

15. The structure of claim 11 wherein the first terminal is an emitter of the heterojunction bipolar transistor, and the second terminal is a collector of the heterojunction bipolar transistor.

16. The structure of claim 11 wherein the first terminal is a collector of the heterojunction bipolar transistor, and the second terminal is an emitter of the heterojunction bipolar transistor.

17. A method of forming a structure for a heterojunction bipolar transistor, the method comprising:
forming a first cavity in a semiconductor layer;
forming a base layer in the first cavity;
forming a first terminal coupled to the base layer;
forming a second terminal coupled to a portion of the semiconductor layer
forming a contact laterally positioned between the first terminal and the second terminal, wherein the contact is coupled to a portion of the base layer and to the portion of the semiconductor layer;
forming a first sidewall spacer, wherein the first sidewall spacer is laterally positioned between the contact and the first terminal; and
forming a second sidewall spacer, wherein the second sidewall spacer is laterally positioned between the contact and the second terminal,
wherein the second terminal is laterally spaced from the first terminal, the portion of the semiconductor layer is laterally positioned between the second terminal and the base layer, the portion of the base layer includes a first surface beneath the contact, the portion of the semiconductor layer includes a second surface beneath the contact, the first sidewall spacer terminates at the first surface, and the second sidewall spacer terminates at the second surface.

18. The method of claim 17 wherein the contact directly contacts the portion of the base layer and the portion of the semiconductor layer.

19. The method of claim 17 wherein the portion of the base layer and the portion of the semiconductor layer intersect at an interface beneath the contact.

20. The method of claim 17 wherein forming the contact laterally positioned between the first terminal and the second terminal comprises:
removing a dummy structure from between the first sidewall spacer and the second sidewall spacer to define a second cavity,
wherein the contact is formed in the second cavity.

* * * * *